United States Patent [19]
Lammert

[11] Patent Number: 5,994,194
[45] Date of Patent: Nov. 30, 1999

[54] SELF-ALIGNED BASE OHMIC METAL FOR AN HBT DEVICE CROSS-REFERENCE TO RELATED APPLICATIONS

[75] Inventor: Michael D. Lammert, Manhattan Beach, Calif.

[73] Assignee: TRW Inc., Redondo Beach, Calif.

[21] Appl. No.: 09/074,199

[22] Filed: May 7, 1998

Related U.S. Application Data

[63] Continuation-in-part of application No. 08/676,697, Jul. 10, 1996, Pat. No. 5,804,487.

[51] Int. Cl.$^6$ .................................................. H01L 21/331
[52] U.S. Cl. .......................... 438/319; 438/320; 438/321; 438/670; 438/944; 438/951; 148/DIG. 72; 148/DIG. 100
[58] Field of Search ..................................... 438/320, 319, 438/321, 343, 926, 670, 571, 944, 951, FOR 455, FOR 389; 148/DIG. 72, DIG. 100

[56] References Cited

U.S. PATENT DOCUMENTS

| | | |
|---|---|---|
| 4,818,712 | 4/1989 | Tully . |
| 4,889,831 | 12/1989 | Ishii et al. . |
| 4,965,650 | 10/1990 | Inada et al. . |
| 5,106,766 | 4/1992 | Lunardi et al. . |
| 5,124,270 | 6/1992 | Morizuka . |
| 5,153,692 | 10/1992 | Morizuka . |
| 5,159,423 | 10/1992 | Clark et al. . |
| 5,166,081 | 11/1992 | Inada et al. . |
| 5,208,184 | 5/1993 | Bayraktaroglu . |
| 5,272,095 | 12/1993 | Enquist et al. . |
| 5,283,448 | 2/1994 | Bayraktaroglu . |
| 5,298,439 | 3/1994 | Liu et al. . |
| 5,318,916 | 6/1994 | Enquist et al. . |
| 5,324,671 | 6/1994 | Bayraktaroglu . |
| 5,344,786 | 9/1994 | Bayraktaroglu . |
| 5,411,632 | 5/1995 | Delage et al. . |
| 5,446,294 | 8/1995 | Bayraktaroglu . |
| 5,468,659 | 11/1995 | Hafizi et al. . |
| 5,471,078 | 11/1995 | Bayraktaroglu . |
| 5,485,025 | 1/1996 | Chau et al. . |
| 5,486,483 | 1/1996 | Lammert ................................. 437/39 |
| 5,512,496 | 4/1996 | Chau et al. . |
| 5,736,417 | 4/1998 | Oki et al. ................................. 437/31 |
| 5,804,487 | 9/1998 | Lammert ................................. 438/319 |
| 5,804,877 | 9/1998 | Fuller et al. ............................. 257/745 |
| 5,831,337 | 11/1998 | Sato ......................................... 257/780 |

*Primary Examiner*—Wael Fahmy
*Assistant Examiner*—Long Pham
*Attorney, Agent, or Firm*—Michael S. Yatsko

[57] ABSTRACT

A relatively simple method for providing relatively close spacing between the emitter mesa and the base ohmic metal of a heterojunction bipolar transistor (HBT) on a relatively uniform basis. An emitter and base layer are epitaxially grown on a substrate. An emitter mesa is patterned with an i-line negative photoresist using conventional photolithography. Baking before and after exposure is used to form a resist pattern with a re-entrant profile having about a 0.1 $\mu$m resist overhang. The emitter layer is then etched with a wet etch and or isotropic dry etch to expose a portion of the base ohmic metal to make contact with the base. A second layer of an i-line negative photoresist is applied over the first photoresist. The second layer is used to pattern the base ohmic metal mask. The base ohmic metal is deposited by evaporation. The resist is stripped from the emitter mesa and the non-base ohmic metal regions which lifts the metal deposited on the resist leaving the metal in the base ohmic metal regions, aligned to the emitter mesa at a uniform spacing.

26 Claims, 6 Drawing Sheets

ETCH EMITTER MEGA, RE-COAT WITH BASE OHMIC RESIST

PATTERN BASE OHMIC METAL RESIST, EVAPORATE BASE OHMIC METAL

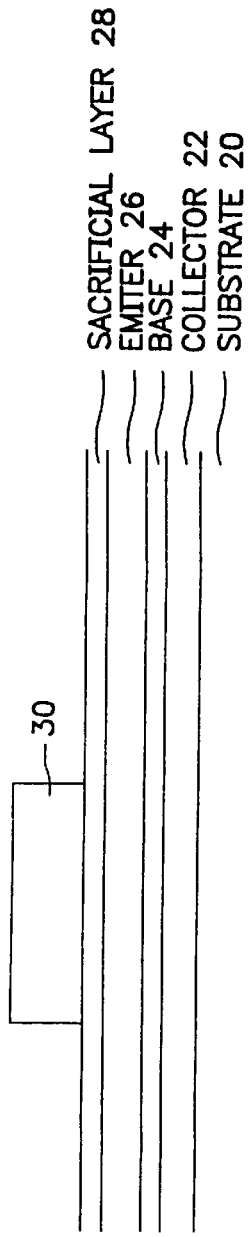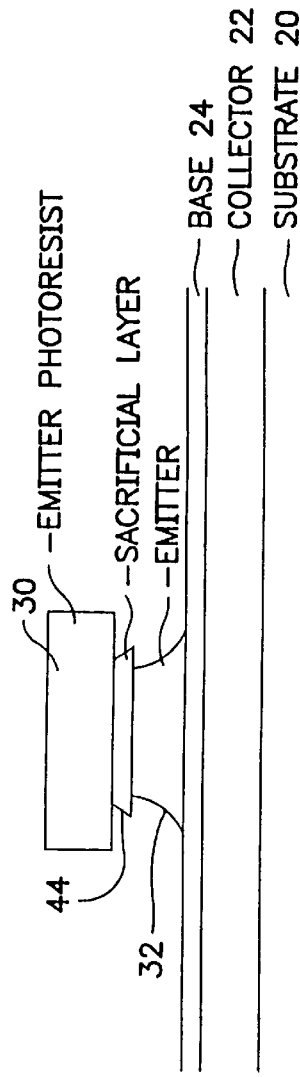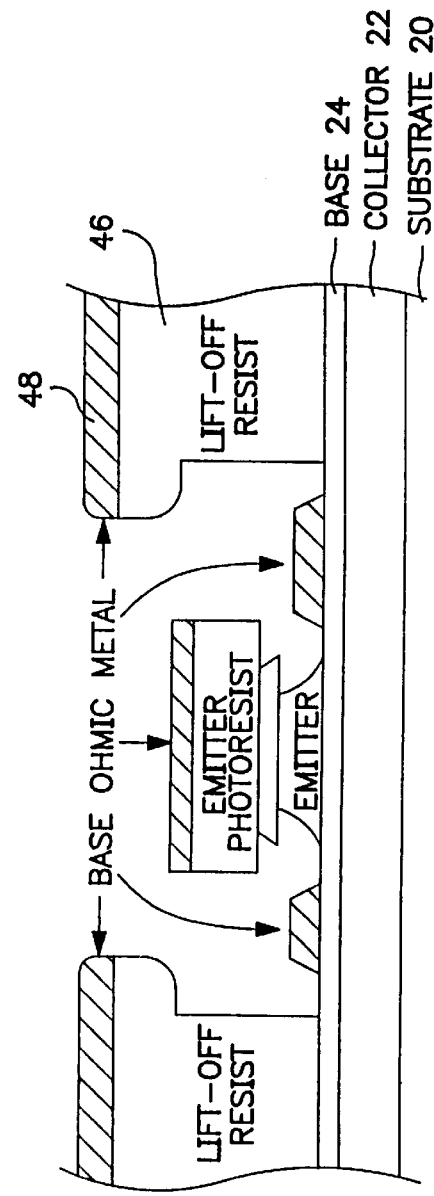

PATTERN EMITTER MEGA RESIST

ETCH EMITTER MEGA, RE-COAT WITH BASE OHMIC RESIST

PATTERN BASE OHMIC METAL RESIST, EVAPORATE BASE OHMIC METAL

LIFT-OFF RESISTS AND BASE OHMIC METAL OVER RESISTS

SELF-ALIGNED BASE OHMIC METAL FOR AN HBT DEVICE CROSS-REFERENCE TO RELATED APPLICATIONS

CROSS-REFERENCE TO RELATED APPLICATIONS

This application is a continuation-in-part of U.S. patent application Ser. No. 08/676,697, filed on Jul. 10, 1996, entitled "Method of Fabricating High Beta HBT Devices", by Lammert, assigned to the same assignee as this present invention now U.S. Pat. No. 5,804,487.

BACKGROUND OF THE INVENTION

1. Field of the Invention

The present invention relates to a method for fabricating integrated circuits and more particularly to a method for achieving controllable spacing between the emitter mesa and the base ohmic metal of a heterojunction bipolar transistor (HBT).

2. Description of the Prior Art

Heterojunction bipolar transistors (HBT's) are known in the art. Examples of methods of fabricating such HBT's are disclosed in U.S. Pat. Nos. 5,159,423; 5,272,095; 5,411,632; 5,446,294; 5,468,659; and 5,485,025. Such HBT's normally include a substrate, as well as epitaxially grown collector, base and emitter layers known to be formed by various methods, including molecular beam epitaxy. Such HBT's are normally formed with an emitter mesa, normally formed by well-known photolithography techniques. Known metalization techniques are used to form ohmic metal contacts on the emitter mesa, as well as the base.

It is known in the art that the base ohmic metal spacing to the emitter mesa is relatively critical to the device performance. In particular, if the base ohmic metal is deposited too close to the emitter mesa, a potential leakage path between the base and the emitter can be created, resulting in degradation of the gain ($\beta$) of the device. Should the spacing between the base ohmic metal and emitter mesa be too large, the parasitic base resistance of the device will be too large, thereby degrading the performance of the HBT.

Various methods are known for controlling the spacing of ohmic contacts for various integrated circuits, including HBT's. Various methods rely on self-alignment of the base ohmic metal and the emitter mesa. For example, one known self-alignment method relies on etching the emitter with an emitter photoresist layer and retaining that layer during the patterning of the lift-off of the photoresist for the base ohmic metal. However, it is known that the spacing between the base ohmic metal and the emitter mesa is not controllable with such a method.

Another known method for controlling the spacing between the base ohmic metal and the emitter mesa relies on so-called spacer technology, frequently used in silicon processing. In that method, the emitter mesa is an anisotropically etched. After the emitter mesa is formed, a spacer layer is deposited and anisotropically etched. A base ohmic metal is patterned and lifted off by conventional techniques, except from over the spacer and emitter. The removal of the base ohmic metal from the spacer and emitter is known to done by ion milling. Unfortunately, damage from the anisotropic etches and the high-defect density usually encountered in the ion milling process limit the usefulness of this type of spacer technology.

Other methods for controlling the spacing between the emitter mesa and the base ohmic contacts are disclosed in U.S. Pat. Nos. 5,124,270; 5,159,423; 5,411,632; 5,446,294; 5,468,659; and 5,486,483. U.S. patent application Ser. No. 08/676,697, filed on Jul. 10, 1996, entitled "Method of Fabrication High Beta HBT Devices", by Lammert, assigned to the same assignee on the present invention now U.S. Pat. No. 5,804,487, also discloses a method for controlling the spacing of the base contacts relative to an emitter mesa. Although the methods described in the patent application and patents do provide some control of the spacing between the base ohmic metal and the emitter mesa, the methods disclosed are relatively complex and involve quite a few process steps.

SUMMARY OF THE INVENTION

It is an object of the present invention to provide a method for controlling the spacing between the emitter mesa and base ohmic metal that solves the problem of the prior art.

It is yet another object of the present invention to provide a method for controlling the spacing between the emitter mesa and base ohmic metal on a relatively uniform basis.

It is yet another object of the present invention to provide a relatively simple method for controlling the spacing between an emitter mesa and the base ohmic metal.

Briefly, the present invention relates to a relatively simple method for providing relatively close spacing between the emitter mesa and the base ohmic metal of a heterojunction bipolar transistor (HBT) on a relatively uniform basis. An emitter and base layer are epitaxially grown on a substrate. An emitter mesa is patterned with an i-line negative photoresist using conventional photolithography. Baking before and after exposure is used to form a resist pattern with a re-entrant profile having about a 0.1 $\mu$m resist overhang. The emitter layer is then etched with a wet etch and or isotropic dry etch to the etch depth required to make contact to the base with the base ohmic metal. A second layer of an i-line negative photoresist is applied over the first photoresist. The second layer of resist is used to pattern the base ohmic metal mask. The base ohmic metal is deposited by evaporation. The resist is stripped from the emitter mesa and the non-base ohmic metal regions which lifts the metal deposited on the resist leaving the metal in the base ohmic metal regions, aligned with the emitter mesa.

BRIEF DESCRIPTION OF THE DRAWING

These and other objects of the present invention will be readily understood with reference to the following specification and attached drawing, wherein:

FIGS. 1–4 are sectional views of a heterojunction bipolar transistor (HBT), showing the successive steps in the method in accordance with the present invention for controlling the spacing between the base ohmic metal and the emitter mesa;

DETAILED DESCRIPTION OF THE INVENTION

Figure 4:
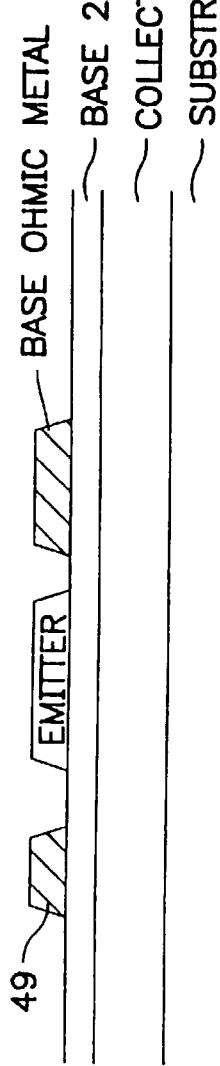

The present invention relates to a heterojunction bipolar transistor (HBT) and, in particular, to a method for controlling the spacing of the base ohmic metal relative to either the emitter mesa or the emitter metal. More particularly, in a first embodiment of the invention, a method is disclosed for self-alignment of the base ohmic metal relative to the emitter mesa. The first method is illustrated in FIGS. 1–4. The second method relates to self-alignment of the base ohmic metal relative to the emitter metal, as illustrated in FIGS. 5–8. FIGS. 9–12 illustrate that both methods, in accordance with the present invention, can be used to form uniform spacing between the base ohmic metal and either the emitter mesa or emitter mesa on all four sides of the emitter mesa, or one, two or three sides of the emitter mesa, as shown. FIGS. 13–22 relate to an alternate embodiment of the invention.

As will be appreciated by those of ordinary skill in the art, the methods, in accordance with the present invention, can also be used to provide self-alignment of base ohmic metal for integrated circuits having multiple emitter devices. Moreover, although the invention is described and illustrated for controlling the spacing between the base ohmic metal and an emitter mesa or emitter metal layer on an HBT device, the principles of the present invention are applicable to other devices where it is desired to place a metal at a relatively close and controllable spacing to another feature or metal layer on the device.

Turning to FIGS. 1–4, a method is illustrated for providing a uniform and reproducible method for spacing the base ohmic metal relative to an emitter mesa on an HBT. As shown in FIG. 1, the HBT includes a substrate 20 and a plurality of vertically stacked epitaxial layers. For example, a collector layer 22, base layer 24 and emitter layer are epitaxially formed on the substrate 20, for example by molecular beam epitaxy (MBE). A sacrificial layer 28 is deposited on top of the emitter layer 26. Various dielectric films are suitable for the sacrificial layer, such as $Si_3N_4$, $SiO_2$ or $Al_2O_3$. In addition to dielectric films, various organic films or metal films may also be used for the sacrificial layer 28. In order to be suitable for the method, the organic films and metal films must be able to be etched isotropically with good selectivity to both the emitter resist and the emitter semiconductor layer, as well as be able to be etched with a uniform undercut and not attacked by an emitter etchant. The thickness of the sacrificial layer is chosen to enhance the control of an undercut to be described below.

After the sacrificial layer 28 is deposited on the emitter layer 26, an emitter photoresist 30 is spun onto the sacrificial layer 28 to form an emitter mesa 32. The emitter photoresist 30 is patterned using conventional lithography. In particular, a photomask 34 (FIGS. 9–12) is used for patterning the emitter photoresist 30 to form the emitter mesa 32. As shown in FIGS. 9–12, various photomasks 36, 38, 40 and 42 can be used to pattern the base ohmic metal to create self-alignment of the emitter mesa or emitter metal along four, three, two or one side of the emitter mesa or emitter metal. The photomask 34 is disposed adjacent the emitter photoresist 30 and exposed with ultraviolet light. After development of the photoresist by conventional techniques, emitter photoresist 30 is formed as shown in FIG. 1.

The type of photoresist used for the emitter photoresist 30 must be compatible with the base ohmic metal lift-off process. For example, if a conventional positive photoresist material is used for the base ohmic metal lift-off process, the emitter photoresist 30 should be either a non-reacting resist, such as polymethylmethacrylate (PMMA) or a conventional photoresist that is hardened by a process, such as by deep ultraviolet (UV) exposure or e-beam flood exposure or a high-temperature photoresist that can be hardened by high-temperature baking. If a dual-layer photoresist is used for the base ohmic metal lift-off, such as coating a layer of PMMA by conventional positive photoresist, then the emitter photoresist material can be any conventional positive photoresist that has been hardened to the point that it will not be distorted in the processing of the dual layer photoresist, hardened by high-temperature baking before the device is coated for the base ohmic metal resist process.

Once the emitter photoresist 30 is formed as shown in FIG. 1, the sacrificial layer 28 is etched isotropically to produce an undercut 44 (FIG. 2) in the sacrificial layer 28. The sacrificial layer 28 may also be etched with a combined isotropic and anisotropic etch to produce the undercut 44. An important aspect of the invention is that the undercut 44 of the sacrificial layer 28 determines the spacing of the base ohmic metal relative to the emitter mesa 32. Once the undercut 44 is formed in the sacrificial layer 28, the emitter layer 26 is etched with an isotropic (or mostly isotropic) etch, exposing a portion of the base layer 24. With the emitter photoresist 30 in place, the device is recoated with a photoresist (lift-off photoresist) 46 to form the pattern of the base ohmic metal. The lift-off photoresist 46 is patterned to have a final profile with a re-entrant slope formed on the exposed base layer 24 as shown in FIG. 3. The re-entrant slope controls the outer perimeter of the base ohmic metal pattern. Various processes may be used for patterning the lift-off resist 46. For example, the photoresist 46 may be a surface treatment of a conventional photoresist with chlorobenzene. Other processes for patterning the lift-off photoresist 46 include: a dual-layer resist, which consists of a conventional positive photoresist over a second layer of resist, such as PMMA; a negative i-line resist; or a positive resist used with image reversal. All such processes are suitable for patterning the lift-off resist 46 with a re-entrant slope as illustrated in FIG. 3.

If the base ohmic metal lift-off pattern is defined with the dual-layer resist process, such as coating of PMMA followed by conventional positive resist, then the emitter resist can be any conventional positive resist that has been hardened to the point where it will not become distorted in the processing of the dual-base ohmic metal resist process. The simplest material for the emitter resist is a high-temperature resist that is hardened with a high-temperature bake before the wafers are coated for the base ohmic metal resist process.

After the lift-off resist 46 is patterned with a re-entrant slope, the base ohmic metal 48 is deposited, for example, by evaporation. As shown in FIG. 3, the base ohmic metal 48 is deposited on the emitter photoresist 30, as well as the lift-off photoresist 46. The undercut 44 on the sacrificial layer 28 controls the spacing of the base ohmic metal deposited on the base layer 24 to provide uniform and controllable spacing relative to the emitter mesa 32 to provide HBT's with a relatively high gain (β) with a relatively low parasitic resistance. The base ohmic metal on the emitter photoresist 30, as well as the lift-off photoresist 46, is lifted off by dissolving both the emitter photoresist 30, as well as the lift-off photoresist 46. After lift-off of the base ohmic metal 48, the sacrificial layer 28 is stripped using an isotropic etch, leaving a base ohmic metal region 49 (FIG. 4) spaced relative to the emitter mesa 32 as determined by the undercut 44 of the sacrificial layer 38.

In an alternate embodiment of the invention, an oxygen plasma descum may be used prior to the evaporation of the base ohmic metal to enhance the adhesion of the metal. If an oxygen plasma descum is used, the final base ohmic metal to emitter mesa spacing is determined by the undercut 44 of the sacrificial layer 28, as well as the amount of photoresist removed in the plasma descum from the sidewalls of the emitter photoresist 30.

A method for controlling the spacing of the base ohmic metal relative to the emitter metal is disclosed in FIGS. 5–8. In this method, a collector layer 52, base layer 54 and an emitter layer 56 are epitaxially grown on a substrate layer 50, for example, by molecular beam epitaxy. An emitter ohmic metal 58, which may be a single metal layer or a combination of metal layers, is deposited on the emitter layer 56. Suitable metals for the emitter ohmic metal 58 include titanium (Ti), titanium tungsten (TiW), tungsten (W) and titanium nitride (TiN). The metal for the emitter metal ohmic metal 58 is selected to achieve low contact resistance relative to the emitter layer 56. In addition, the metal selected for the emitter ohmic metal 58 must not interfere with the etching of the emitter mesa and must be able to be etched isotropically with good selectivity to both the emitter resist and emitter layer 56 as well as be able to be etched with a uniform undercut and not be attacked by the emitter etchant.

Figure 5:
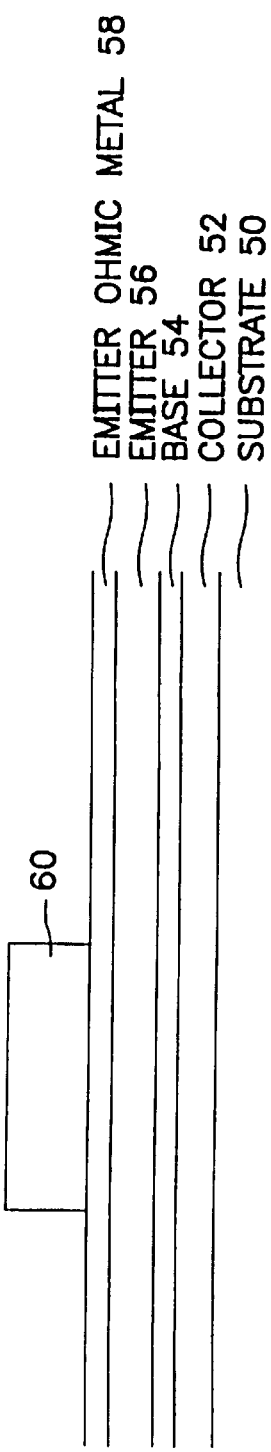
FIGS. 5–8 are sectional views of an HBT, showing the successive steps in an alternate embodiment of the invention for controlling the spacing between the base ohmic metal and the emitter metal.
Figure 6:
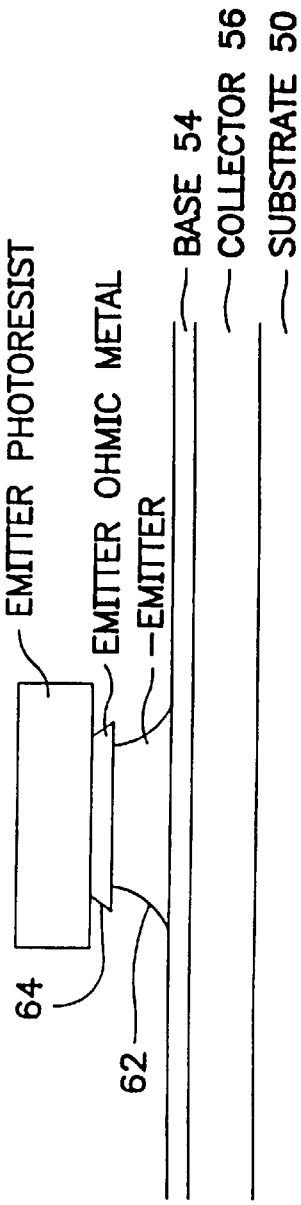
Figure 7:
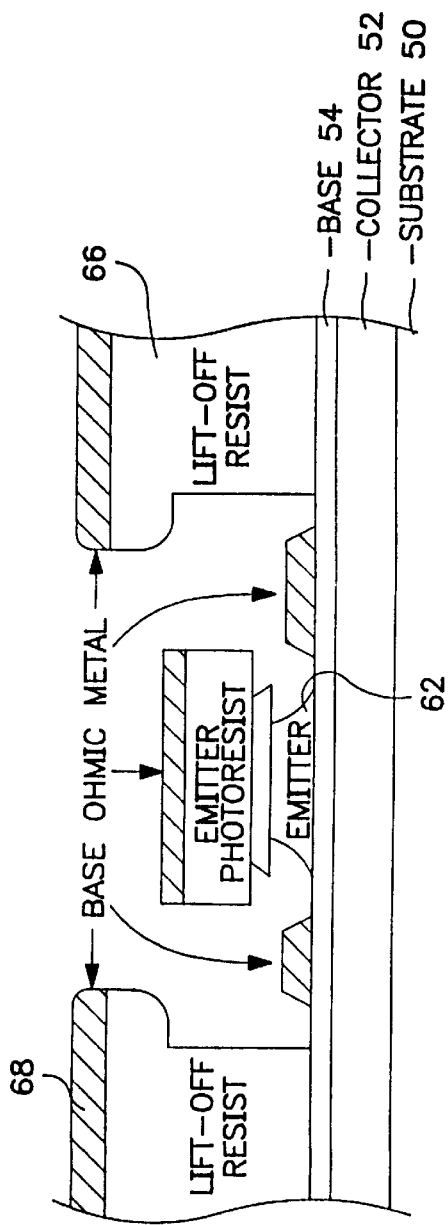
Figure 8:
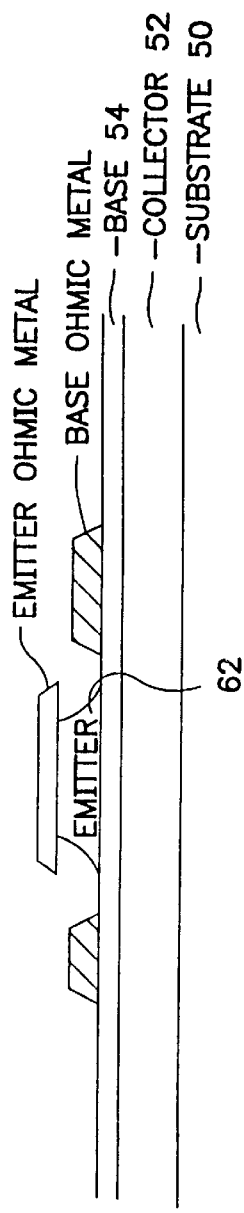
Figure 9:
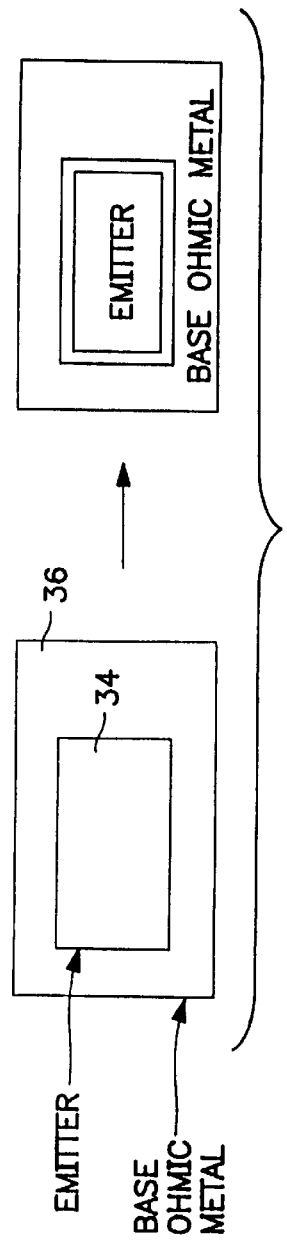
FIGS. 9–12 illustrate the photomasks and resulting spacing of the emitter or emitter metal relative to the base ohmic metal for self-alignment of the four, three, two and one sides of the emitter, respectively.
Figure 10:
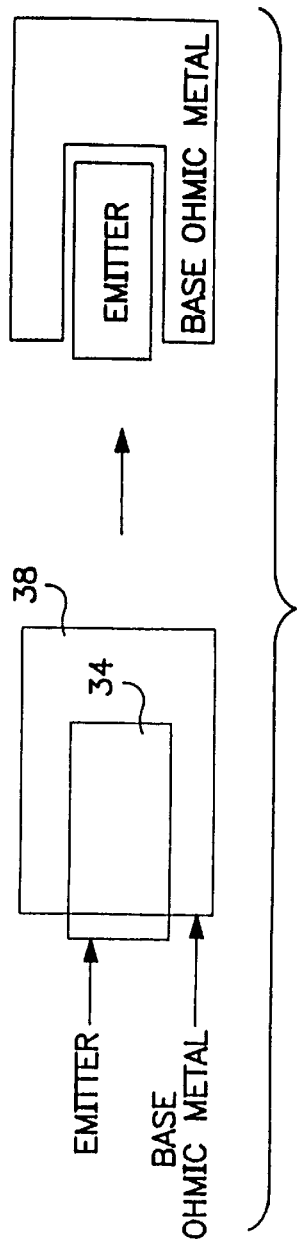
Figure 11:
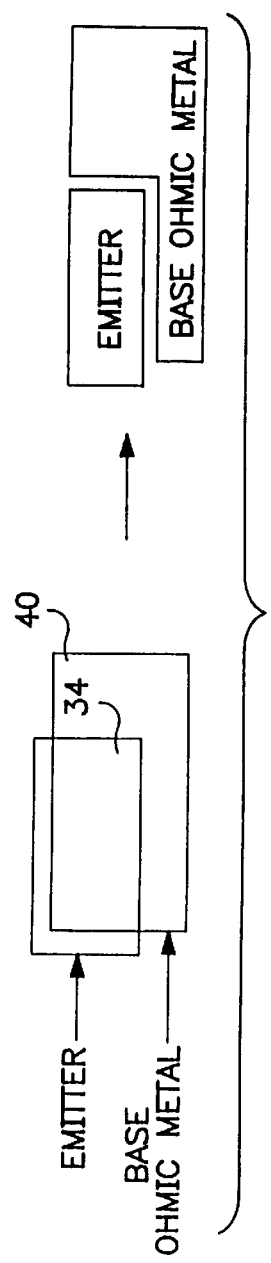
Figure 12:
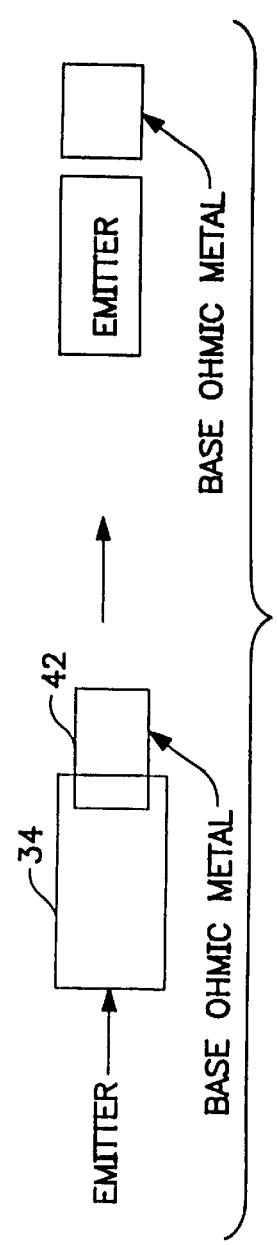

After the emitter ohmic metal 58 is deposited on the emitter layer 56, an emitter photoresist 60 is patterned as discussed above to form an emitter mesa 62, as shown in FIG. 5. The emitter ohmic metal layer 58 is etched with an isotropic or combined anisotropic and isotropic etch process, using an over etch of the metal to establish an undercut 64 used to self-align the spacing between the emitter ohmic metal and the base ohmic metal, as shown in FIG. 6.

The remaining steps in the method are identical to the method described above, except the emitter ohmic metal 58 over the emitter mesa 62 is not stripped after the base ohmic metal lift-off. Briefly, a lift-off photoresist 66 is spun onto the device and patterned with a conventional process for lift-off metalization as discussed above, forming a final profile of the lift-off photoresist 66 with a re-entrant slope as discussed above. Base ohmic metal 68 is then deposited, for example by evaporation, leaving base ohmic metal on the lift-off photoresist 66, the emitter photoresist 60, as well as a pattern of base ohmic metal on the base layer 54, surrounding the emitter mesa 62. As discussed above, the spacing between the base ohmic metal on the base layer 54 and the emitter mesa 62 is controlled by the undercut 64, formed in the emitter ohmic metal 58. The base ohmic metal on the emitter photoresist 60, as well as the lift-off photoresist 66 is stripped off, leaving the emitter ohmic metal 58, formed on the emitter mesa 62, and base ohmic metal on the base layer 54, uniformly and controllably spaced, relative to the emitter ohmic metal 58 by way of the undercut 64 in emitter ohmic metal 58.

The invention illustrated in FIGS. 13–22 and described below relate to an improved method for forming a hetor-junction bipolar transistor (HBT) with relatively low base resistance to achieve high performance. More particularly, two factors are known to control the base resistance of an HBT. One factor relates to providing a relatively high doping level in the base region. The other factor in forming an HBT with a low base resistance is making the metal contact to the base layer as close to the emitter as possible but not too close to cause excessive emitter base current leakage. The invention described in FIGS. 13–22 provides a relatively simple method for controlling the spacing between the base metal ohmic region and the emitter mesa to lower the base resistance while containing a sufficient distance between the base ohmic metal region and the mesa to prevent base current leakage.

Figure 13:
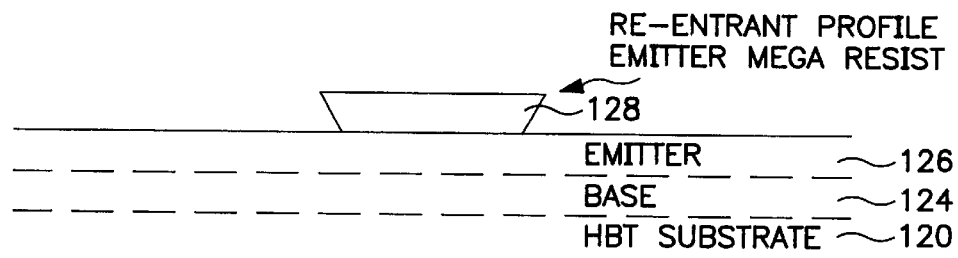
FIGS. 13–16 are sectional views of a heterojunction bipolar transistor (HBT) showing the successive steps in an alternate method in accordance with the present invention for controlling the spacing between the base ohmic metal and the emitter mesa.

Turning to FIGS. 13–16, the HBT includes a substrate 120 and a plurality of vertical stacked epitaxial layers. For example, a base layer 124, and an emitter layer 126 may be formed on the substrate layer 120 by molecular beam epitaxy (MBE). Each of the layers may be formed from 2, 3 or more epitaxial layers. In accordance with the invention as illustrated in FIG. 13, the device is patterned with an emitter mesa mask (not shown) using an i-line negative photoresist, such as the NFR family of resists as supplied by the Japan Synthstic Rubber Company. An important aspect of the invention relates to forming the i-line negative resist with a re-entrant profile as generally illustrated in FIG. 13 and identified with a reference numeral 128. The re-entrant profile is formed using a pre-exposure bake of about 30 sec. to 120 sec. at about 90° C., an exposure with an i-line aligner, a post-exposure bake of about 10 sec. to 90 sec. at about 90° C., and development in any developer compatible with the i-line resist to achieve the re-entrant profile 126 as illustrated in FIG. 13. The emitter mesa resist 128 should be formed to be fairly thin, about 3000 A–5000 A so that devices along the perimeter of the wafer will have a nearly uniform spacing between the base ohmic metal deposited by lift off evaporation and the emitter mesa along all edges of the emitter.

Figure 14:
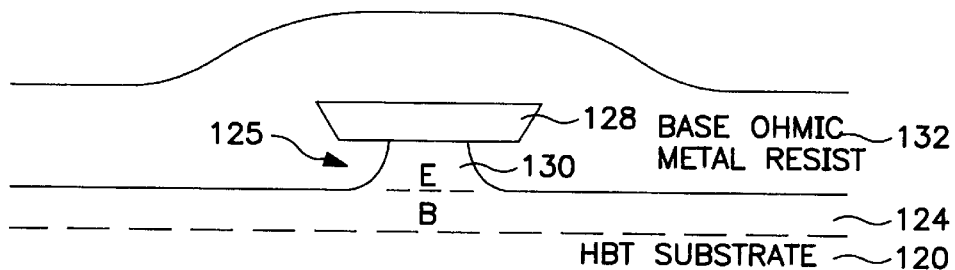

As shown in FIG. 13, the emitter mesa resist will have a re-entrant profile with about 0.1 µm resist overhang. The final spacing between the emitter mesa and p-ohmic metal can be adjusted be increasing or decreasing the amount of resist overhang from the 0.1 µm nominal value. Shorter exposures and post exposure bake times for a fixed pre-exposure bake and development time will result in increased resist overhang. In order to prevent the emitter mesa resist 128 from being dissolved during future processing, the emitter mesa resist 128 is baked at a temperature of 90–100°, for example, for between 1–30 minutes. In order to prevent residue from the development of the emitter mesa resist 128 from interfering with the etching of the emitter mesa 130, the device may be subjected to a brief $O_2$ plasma descumming to remove to about 100 A–300 A of the emitter mesa resist 128 prior to emitter mesa etching. An emitter mesa 130 may then be formed by etching with a suitable wet etchant or isotropic dry etch to a depth which will permit a base ohmic metal to make contact with the base layer 124 and also form the undercuts 125 as illustrated in FIG. 14. After the emitter mesa 130 is etched, as illustrated in FIG. 14, the device is recoated with a second layer 132 of an i-line negative resist at a thickness of about 1 µm–2 µm and patterned with a base ohmic metal mask. Alternatively, the base ohmic metal can be patterned using any other lift-off resist processes that are compatible with the emitter mesa i-line resist, such as a dual layer resist of PMMA plus any conventional positive resist, or a single layer conventional positive resist treated with chlorobenzene. As shown in FIGS. 17–20, the placement of the base emitter mask relative to the emitter mesa 128 can be used to create self-alignment of the base ohmic metal along 1, 2, 3 or 4 sides of the emitter mesa 128.

Figure 15:
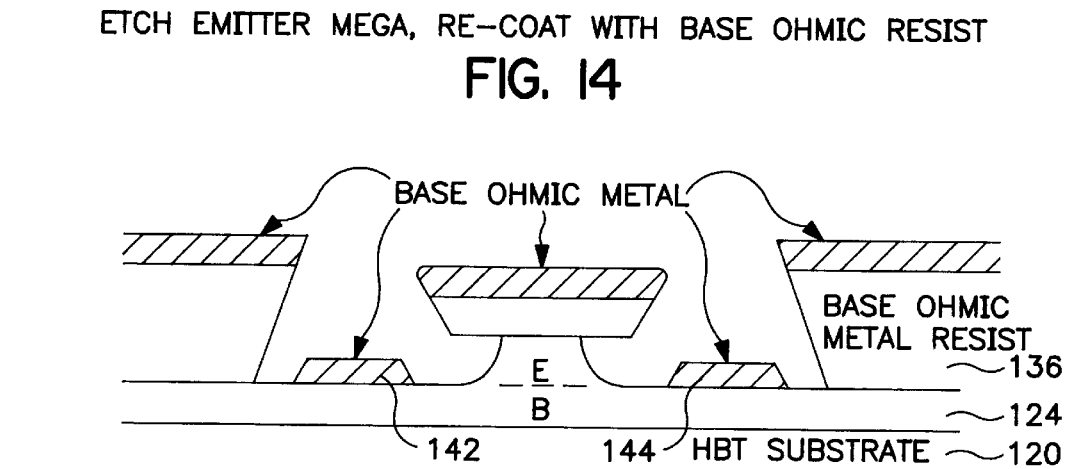

As shown in FIG. 15, after the base metal resist is patterned, the base metal ohmic resist is exposed to ultraviolet light and developed to produce the base metal ohmic resist profile as illustrated in FIG. 15. In order to remove any residue resulting from the development of the base metal ohmic resist 136, the device may be subjected to plasma $O_2$ descumming to remove about 100 A–300 A of resist. This descumming also insures good adhesion of the evaporated base ohmic metal and reduces the final spacing of the base ohmic metal to the emitter mesa. An increased initial emitter resist overhang can be used to compensate for the effects of the $O_2$ plasma descumming which reduces the amount of the resist overhang. A dilute acid, such as HCl, HF, or $H_3PO_4$, may be used to remove surface oxide prior to the base ohmic metal evaporation.

Figure 16:
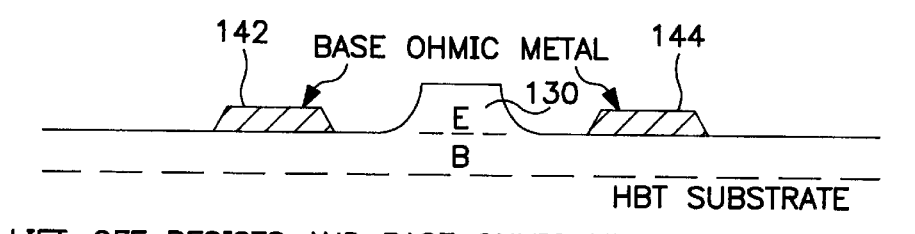

As shown in FIG. 15, the base ohmic metal is then evaporated onto the base metal regions 142 and 144. Additional base metal ohmic is deposited on top of the emitter mesa resist 128 as well as the base ohmic metal resist 136. As shown in FIG. 16, the base ohmic metal on the emitter resist 128 as well as the base metal ohmic resist 136 is lifted off by conventional techniques to produce the resulting base ohmic metal contacts 142 and 144, uniformly and controllably spaced related relative to the emitter mesa 130 by way of the undercuts 125 in the emitter mesa 130 and the emitter resist overhang 128, shown in FIG. 14.

Figure 17:
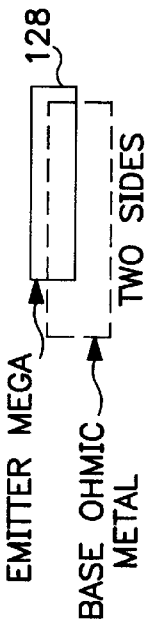
FIGS. 17–20 are plan views illustrating the photomasks and resulting spacing of the emitter mesa relative to the base ohmic metal for self-alignment of 1, 2, 3 and 4 sides of the emitter mesa, respectively.
Figure 18:
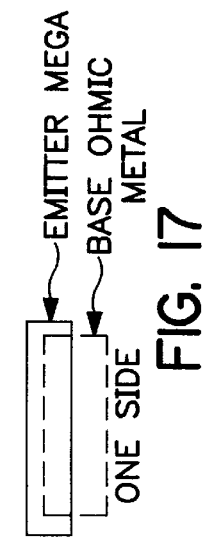
Figure 19:
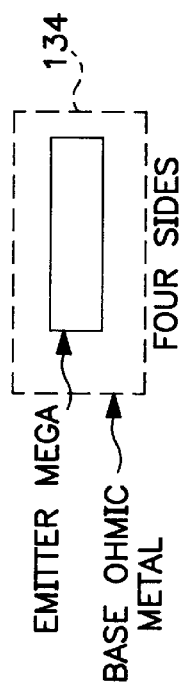
Figure 20:
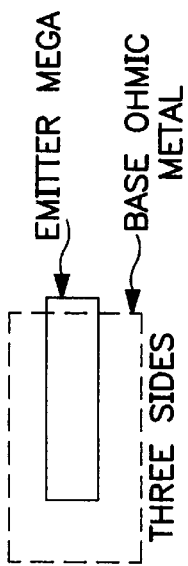
Figure 21:
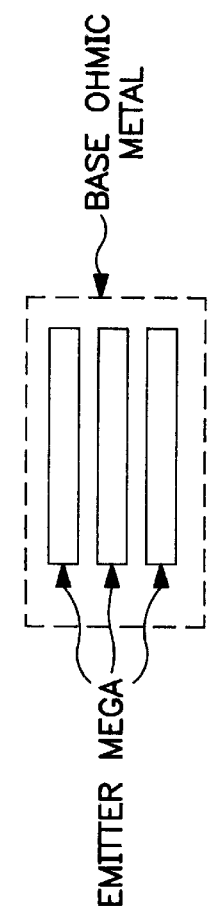
FIG. 21 is a plan view illustrating a photomask and resulting spacing between the emitter mesa and the base ohmic metal for a device for having multiple emitters.
Figure 22:
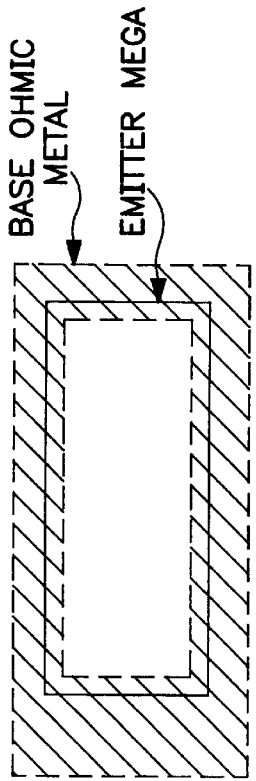
FIG. 22 is a plan view illustrating a photomask and resulting spacing for improving the lift off on a relatively large area emitter.

As mentioned above, the base ohmic metal can be aligned to all four sides of the emitter mesa 130 or 1, 2 or 3 sides, depending on the placement of the base ohmic pattern relative to the emitter mesa pattern as illustrated in FIGS. 17 and 20. The method in accordance with the present invention is also suitable for other embodiments. For example, FIG. 21 illustrates the applicability of the method in accordance with the present invention to an HBT with multiple emitters. In order to improve the ability of liftoff of the base ohmic metal over a relatively large area emitter, the base ohmic metal can be patterned to cover only the edge of the emitter mesa as shown in FIG. 22.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for controlling the spacing between an ohmic metal and an emitter mesa on an integrated circuit formed with a substrate and a plurality of vertically stacked epitaxial layers, including a base layer and an emitter layer formed on top, the method comprising the steps of:
   (a) depositing an emitter mesa photoresist on top of said emitter layer;
   (b) forming said emitter mesa photoresist to have a re-entrant profile, defining an overhand on top of said emitter mesa;
   (c) etching said emitter layer to form an emitter mesa and exposing said base layer, said emitter mesa photoresist overhanging said emitter mesa with said re-entrant profile after said etching;
   (d) depositing a base ohmic metal photoresist on said emitter mesa, photoresist and said exposed base layer;
   (e) patterning and developing said base ohmic metal photoresist to define base ohmic metal regions;
   (f) depositing base ohmic metal on said base ohmic metal regions; and
   (g) lifting off said base ohmic metal photoresist, as well as said emitter mesa photoresist leaving an ohmic metal region around said emitter mesa that is uniformly spaced relative to said emitter mesa.

2. A method as recited in claim 1, wherein said emitter mesa photoresist is a negative photoresist.

3. A method as recited in claim 2, wherein said negative photoresist is an i-line photoresist.

4. A method as recited in claim 1, wherein said base ohmic metal photoresist is a negative photoresist.

5. A method as recited in claim 4, wherein said negative photoresist is an i-line photoresist.

6. A method as recited in claim 1, wherein said etching is wet etching.

7. The method as recited in claim 1, wherein said etching is isotropic dry etching.

8. The method as recited in claim 1, wherein said step of forming said emitter mesa photoresist includes exposing and developing said emitter mesa photoresist.

9. The method as recited in claim 8, further including the steps of baking said emitter mesa photoresist prior to said step of exposing and prior to said step of developing.

10. The method as recited in claim 9, further including the step of baking said emitter mesa photoresist after said steps of exposing and developing.

11. The method as recited in claim 1, wherein said emitter mesa photoresist is formed with a thickness in the range of 3000 A–5000 A.

12. The method as recited in claim 1, further including the step of descumming prior to said etching step.

13. The method as recited in claim 1, further including the step of descumming after said step of developing said base ohmic metal resist.

14. A method for controlling the spacing of the base ohmic metal relative to an emitter mesa on a heterojunction bipolar transistor (HBT) having a substrate and a plurality of vertically stacked epitaxial layers including a base layer, and an emitter layer formed on top, the method comprising the steps of:
   (a) depositing an emitter mesa photoresist on top of said emitter layer;
   (b) patterning and developing said emitter mesa photoresist with a re-entrant profile;
   (c) etching said emitter layer to form said emitter mesa and exposing a portion of said base layer, leaving intact said emitter mesa photoresist with said re-entrant profile;
   (d) depositing a phase ohmic metal photoresist on top of said exposed base layer and said emitter mesa photoresist;
   (e) patterning and developing said base ohmic photoresist to define base ohmic metal regions;
   (f) depositing a base ohmic metal on said emitter mesa photoresist, said base ohmic metal photoresist and said exposed portion of said base layer; and
   (g) lifting off said base ohmic metal deposited on said emitter mesa and base ohmic metal photoresists along with said emitter mesa and second base ohmic metal photoresist leaving a base ohmic metal region around said emitter mesa.

15. A method as recited in claim 14, wherein said emitter mesa photoresist is a negative photoresist.

16. A method as recited in claim 15, wherein said negative photoresist is an i-line photoresist.

17. A method as recited in claim 14, wherein said base ohmic metal photoresist is a negative photoresist.

18. A method as recited in claim 17, wherein said negative photoresist is an i-line photoresist.

19. A method as recited in claim 14, wherein said etching is wet etching.

20. The method as recited in claim 14, wherein said etching is isotropic dry etching.

21. The method as recited in claim 14, wherein said step of forming said emitter mesa photoresist includes exposing and developing said emitter mesa photoresist.

22. The method as recited in claim 21, wherein said emitter mesa photoresist is an i-line negative photoresist.

23. The method as recited in claim 22, further including the step of baking said emitter mesa photoresist after said steps of exposing and developing.

24. The method as recited in claim 14, wherein said emitter mesa photoresist is formed with a thickness in the range of 3000 Å–5000 Å.

25. The method as recited in claim 14, further including the step of descumming prior to said etching step.

26. The method as recited in claim 14, further including the step of descumming after said step of developing said base ohmic metal resist.

* * * * *